(12) United States Patent
Minami et al.

(10) Patent No.: US 8,298,627 B2
(45) Date of Patent: Oct. 30, 2012

(54) METHOD AND APPARATUS OF PLASMA TREATMENT

(75) Inventors: Takashi Minami, Kawasaki (JP); Shigenori Ishihara, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 13/017,875

(22) Filed: Jan. 31, 2011

(65) Prior Publication Data

US 2011/0124200 A1    May 26, 2011

Related U.S. Application Data

(63) Continuation of application No. 12/783,683, filed on May 20, 2010, now abandoned, which is a continuation of application No. PCT/JP2009/062811, filed on Jul. 15, 2009.

(30) Foreign Application Priority Data

Jul. 15, 2008 (JP) .................. 2008-183824

(51) Int. Cl.
C23C 16/00 (2006.01)
H05H 1/24 (2006.01)
(52) U.S. Cl. .................... 427/569; 427/248.1
(58) Field of Classification Search .......... 427/569; 118/715, 723 MW, 729
See application file for complete search history.

(56) References Cited

U.S. PATENT DOCUMENTS

| | | | | |
|---|---|---|---|---|
| 4,313,783 A | * | 2/1982 | Davies et al. | 438/716 |
| 5,091,207 A | * | 2/1992 | Tanaka | 427/8 |
| 5,575,853 A | * | 11/1996 | Arami et al. | 118/708 |
| 6,283,060 B1 | | 9/2001 | Yamazaki et al. | 118/723 E |
| 6,478,923 B1 | * | 11/2002 | Igarashi | 156/345.26 |
| 6,499,427 B1 | | 12/2002 | Yamazaki et al. | 118/723 E |
| 2002/0192394 A1 | * | 12/2002 | Ebe et al. | 427/569 |
| 2003/0066485 A1 | | 4/2003 | Yamazaki et al. | 118/723 E |
| 2003/0094135 A1 | * | 5/2003 | Komiya et al. | 118/715 |
| 2005/0176221 A1 | * | 8/2005 | Yamazaki et al. | 438/507 |
| 2006/0231032 A1 | * | 10/2006 | Murakami et al. | 118/723 R |
| 2006/0289385 A1 | * | 12/2006 | Kikuchi | 216/67 |

(Continued)

FOREIGN PATENT DOCUMENTS

JP    55016475 A   *   2/1980

(Continued)

OTHER PUBLICATIONS

Machine Translation of JP 06097130 A.*

(Continued)

*Primary Examiner* — David Turocy
(74) *Attorney, Agent, or Firm* — Fitzpatrick, Cella, Harper & Scinto

(57) ABSTRACT

The present invention provides a plasma treatment apparatus and a conditioning method capable of performing a conditioning for the whole vacuum chamber. A plasma treatment apparatus according to an embodiment of the present invention is provided with a moving means for moving a substrate holder (2) between a reaction chamber (8) and a transfer chamber (9) lying on the under side thereof. Moreover, it has such structure that the exhaust conductance of the reaction chamber (8) becomes large when the substrate holder (2) lies in the transfer chamber. Upon the conditioning, the substrate holder (2) is moved to the transfer chamber (9) to allow diffusing species to spread widely, thereby effectively performing the conditioning for both reaction chamber (8) and transfer chamber (9) in the vacuum chamber (1).

3 Claims, 7 Drawing Sheets

U.S. PATENT DOCUMENTS

| | | | |
|---|---|---|---|
| 2007/0051470 A1 | 3/2007 | Iwakoshi et al. | 156/345.28 |
| 2009/0197012 A1 | 8/2009 | Yamazaki et al. | 427/534 |
| 2010/0120238 A1 | 5/2010 | Kitano et al. | 438/586 |

FOREIGN PATENT DOCUMENTS

| | | | |
|---|---|---|---|
| JP | 05-343372 | | 12/1993 |
| JP | 06-097130 | | 4/1994 |
| JP | 06097130 A | * | 4/1994 |
| JP | 10-310870 | | 11/1998 |
| JP | 2004-064018 | | 2/2004 |
| JP | 2007-073751 | | 3/2007 |
| JP | 2007-194361 | | 8/2007 |
| JP | 2007194361 A | * | 8/2007 |
| JP | 2008-050672 | | 3/2008 |
| JP | 2008248395 A | * | 10/2008 |

OTHER PUBLICATIONS

Machine Translation of JP 2007194361 A.*

* cited by examiner

METHOD AND APPARATUS OF PLASMA TREATMENT

CROSS-REFERENCES TO RELATED APPLICATIONS

This application is a continuation application of U.S. patent application Ser. No. 12/783,683, filed May 20, 2010, now abandoned, which is a continuation of International Application No. PCT/JP2009/062811, filed Jul. 15, 2009. This application also claims the benefit of priority from Japanese Patent Application No. 2008-183824, filed Jul. 15, 2008. The contents of the aforementioned applications are hereby incorporated by reference herein in their entireties.

TECHNICAL FIELD

The present invention relates to a method and an apparatus of plasma processing to form an oxide film, a nitride film or the like on a surface of a semiconductor substrate.

BACKGROUND ART

Until now, there has widely been known substrate treatment apparatuses in which a process gas is activated by plasma discharge to give a treatment to a substrate. In such substrate treatment apparatuses, a high-frequency voltage is applied between plural discharge electrodes to generate plasma, which excites and activates the applied gas to perform such substrate treatment as forming a thin film on a substrate surface or performing etching.

However, for example, when a contaminant exists in a chamber, it causes the contamination of the substrate after the treatment, or, when a residual gas exists, an intended effect of the treatment can not be sufficiently obtained. Therefore, for the purpose of adjusting an atmosphere in the chamber prior to the substrate treatment, it is generally performed to introduce a gas that is used in the treatment into the chamber and to generate plasma for conditioning the inside of a vacuum chamber. The conditioning exerts such effect as stabilizing the atmosphere in the chamber, and stabilizing the substrate treatment performance. The conditioning is particularly effective when it is followed by a lot start or a change of the process gas.

Next, the conditioning will be described along with the difference between the conditioning and cleaning that is widely performed for plasma treatment apparatuses. The cleaning means removing impurities generated during the treatment process and making the inside atmosphere and the inner wall of the chamber in a clean state. On the other hand, the conditioning means introducing gas to be used for the process treatment of a semiconductor substrate into the chamber before giving the process treatment, and adjusting the atmosphere in the chamber by making active species, generated by discharging the gas, adhere to the chamber inner wall for the purpose of stabilizing the treatment rate and the film properties throughout a continuous treatment.

When the conditioning is not performed, the state of the chamber inner wall becomes vulnerable to the progress of the treatment and the treatment rate in the continuous processing becomes unstable. Further, if impurities adhere to the chamber inner wall, impurities can be contained in the film to deteriorate film properties. The conditioning is performed in order to improve these adverse effects. As a result, the treatment rate of the continuous treatment becomes stable, and good film properties are obtained.

Patent Document 1 discloses an example of such plasma treatment apparatus. FIG. 3 shows the plasma treatment apparatus in Patent Document 1. The method in Patent Document 1 performs effective plasma conditioning by adjusting an electrode interval upon the conditioning, even when the electrode interval is narrowed to enhance the etching rate.

That is, an electrode elevating mechanism 108 makes the position of an upper electrode 103 variable, and widens the interval between a lower electrode 102 and the upper electrode 103 upon the conditioning as compared with that upon the etching to allow the plasma to spread widely. And, it is designed so as to remove reaction products and the like adhered to a vacuum chamber 101, the lower electrode 102, the upper electrode 103 and the like.

However, Patent Document 1 adopts such construction as generating plasma using electrodes of a parallel flat plate. Consequently, even when the interval between the upper and lower electrodes is widened upon the conditioning to allow the plasma to spread widely, the conditioning is not sufficiently performed in other places, although the conditioning effect is large between electrodes.

As another example, there is a plasma treatment apparatus described in Patent Document 2. FIG. 4 shows the treatment apparatus in Patent Document 2. The method in Patent Document 2 performs rapidly and uniformly the plasma conditioning of the inside of a vacuum vessel of an ECR type microwave plasma treatment apparatus.

That is, high density radicals are generated in a vacuum chamber (a plasma generation chamber 203, a delivery chamber 211). And the position of a stage 208 is set so that the effective conditioning area can expand to the distance, at which the density of the radicals is reduced to half. Then a plasma cleaning using the radicals is carried out. Specifically, the conditioning is performed while setting the gas pressure to be 50 mTorr or more, and moving the stage 208 for placing an object to be treated within 130 mm from the ECR area. The Document describes that the conditioning can be performed rapidly and uniformly within the limited area.

Patent Document 2 describes that the conditioning is performed in a state where the stage lies within 130 mm from the ECR area, however, in the case of this condition, most of the area to be conditioned is the reaction chamber, and the conditioning may not be effective for a lower portion of the vacuum chamber (the conditioning efficiency deteriorates significantly).

[Patent Document]

[Patent Document 1] Japanese Patent Laid-Open No. 05-343372

[Patent Document 2] Japanese Patent Laid-Open No. 06-097130

SUMMARY OF THE INVENTION

In the above-described conventional techniques active species for the conditioning spread only between the parallel plates where plasma is generated or in a small area inside the reaction chamber, and sufficient conditioning may not be performed for the whole interior area of the vacuum chamber. Consequently, there is such problem that the interior parts of the vacuum chamber with insufficient conditioning may give an influence on a film formation rate and film properties upon the substrate treatment.

A purpose of the present invention is to provide a method and apparatus of plasma treatment capable of performing sufficient conditioning for the whole interior part of the vacuum chamber, in order to solve the above problem.

A first aspect of the present invention may be a method of a plasma treatment using a plasma treatment apparatus, the apparatus comprising: a vacuum chamber having a transfer area for transferring a substrate to or from the inside and a reaction area for providing a process treatment for the substrate, and being used in a state of a reduced pressure; a substrate holder for holding the substrate; means for generating plasma in the reaction area; and a moving means for moving the substrate holder between the transfer area and the reaction area, the method comprising the steps of: moving the substrate holder to the transfer area by the moving means prior to providing the process treatment for the substrate in a state such that the substrate is not held on the substrate holder; introducing a same gas as the gas for performing a process treatment for the substrate into the vacuum chamber; generating plasma in the vacuum chamber by the means for generating plasma and making active species in the plasma adhere to the vacuum chamber inner wall to adjust the atmosphere in the vacuum chamber; and making the substrate holder hold the substrate and moving the substrate holder to the reaction area by the moving means to provide the process treatment for the substrate using the gas.

A second aspect of the present invention may be a plasma treatment apparatus comprising: a vacuum chamber having a transfer area for transferring a substrate to or from the inside and a reaction area for providing a process treatment for the substrate; a gas introduction means for introducing a prescribed gas into the vacuum chamber; a substrate holder for holding the substrate; means for generating plasma in the reaction area; and a moving means for moving the substrate holder between the transfer area and the reaction area, wherein: when a conditioning for adjusting an atmosphere in the vacuum chamber is necessary, a conditioning for adjusting an atmosphere in the vacuum chamber is practiced by: before providing the process treatment for the substrate, moving the substrate holder to the transfer area by the moving means; and after that introducing a same gas as the gas to be used in the process treatment into the vacuum chamber by the gas introduction means; generating plasma in the vacuum chamber by the means for generating plasma; and making active species in the plasma adhere to the vacuum chamber inner wall.

A third aspect of the present invention may be a control device of controlling a plasma treatment apparatus, the apparatus comprising: a vacuum chamber having a transfer area for transferring a substrate to or from the inside and a reaction area for providing a process treatment for the substrate; a gas introduction means for introducing a prescribed gas into the vacuum chamber; a substrate holder for holding the substrate; means for generating plasma in the reaction area; and a moving means for moving the substrate holder between the transfer area and the reaction area, and the control device comprising: means for determining whether or not a conditioning for the vacuum chamber is necessary before performing the process treatment for the substrate; means for controlling the moving means so that the substrate holder lies in the transfer area when the conditioning is determined to be necessary; means for controlling the gas introduction means so that a same gas as the gas to be used in the process treatment is introduced into the vacuum chamber before providing the process treatment for the substrate when the substrate holder lies in the transfer area; and means for controlling the means for generating plasma so that the plasma is generated in the vacuum chamber into which the gas has been introduced.

According to the present invention, it becomes possible to expand the conditioning effect to the whole internal area of the vacuum chamber and to stabilize the interior atmosphere of the vacuum chamber before the plasma treatment process by moving the substrate holder into the transfer chamber and enlarging an exhaust conductance with the reaction chamber. Accordingly, it is possible to stabilize the treatment rate and film properties of the plasma treatment for the substrate.

DESCRIPTION OF EMBODIMENTS

Figure 1:
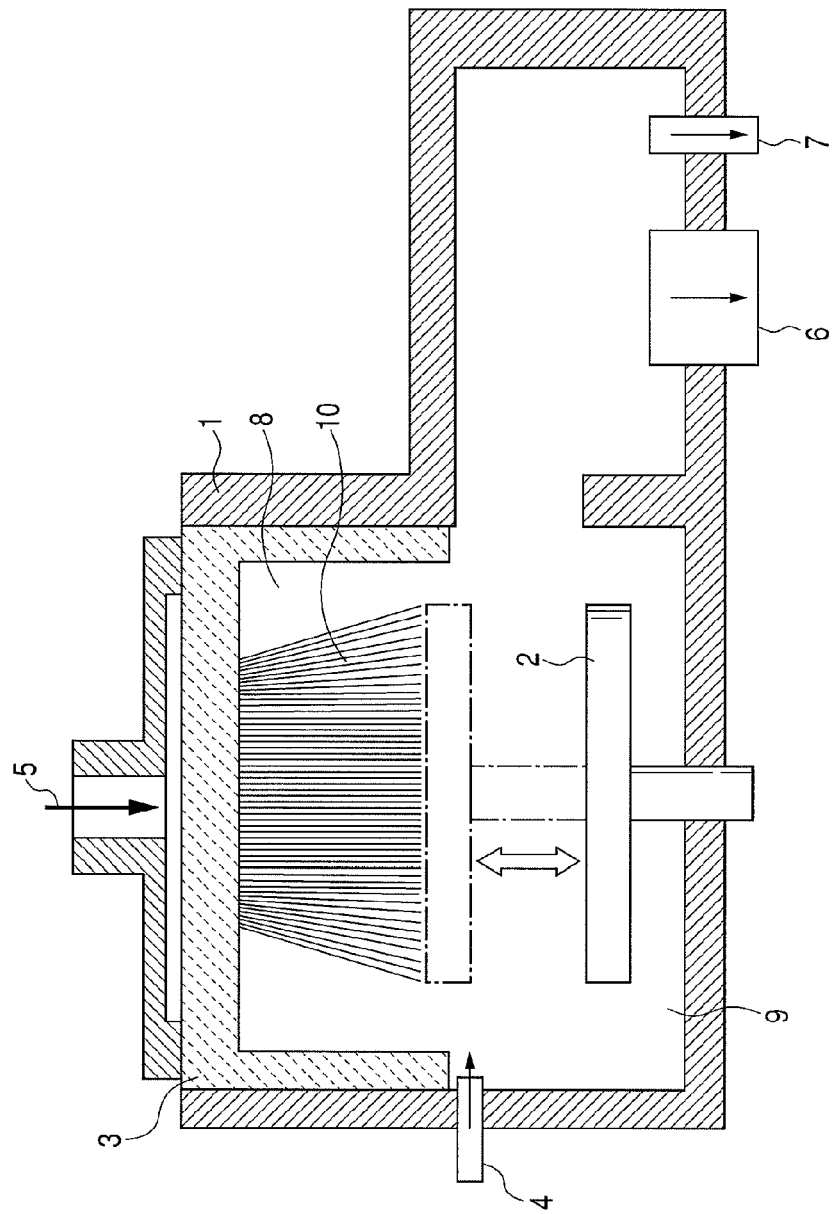
FIG. 1 is a schematic view showing an embodiment of a plasma treatment apparatus according to the present invention.

Hereinafter, embodiments of the present invention will be described in detail with reference to the drawings. Meanwhile, in the drawings to be explained below, ones having the same function are given the same reference numeral, and a repeating explanation thereof is omitted.

FIG. 1 is a schematic view showing a constitution of an embodiment of a plasma treatment apparatus according to the present invention. In FIG. 1, the reference numeral "1" denotes a vacuum chamber for use in a state of reduced pressure. The vacuum chamber 1 is connected to a vacuum pump (not shown) and the inside of the vacuum chamber 1 is kept at an intended vacuum pressure.

In the upper portion of the vacuum chamber 1, a quartz part 3 is disposed. A quartz part 3 has a function of a transparent window for introducing external energy into the vacuum chamber 1 from an external energy supply means 5. External energy such as microwave is introduced into the vacuum chamber 1, to which the process gas is supplied, through the quartz part 3 from the external energy supply means 5 to generate a plasma 10.

The vacuum chamber 1 includes two chambers, a reaction chamber 8 in the upper portion thereof and a transfer chamber 9 in the lower portion thereof. Upon the plasma treatment for the substrate processing, plasma 10 is generated in the reaction chamber 8. The transfer chamber 9 is a chamber for carrying a semiconductor substrate to or from the inside of the vacuum chamber. In the vacuum chamber 1, a substrate holder 2 for holding a semiconductor substrate is provided.

The substrate holder 2 holds a semiconductor substrate, and moves up and down between the reaction chamber 8 and the transfer chamber 9 by a moving means (not shown). The moving means has, for example, a driving source such as a motor disposed outside of the vacuum chamber 1, an elevating mechanism to move the substrate holder 2 in the vertical direction utilizing driving power of the driving source, or the like. A semiconductor substrate is delivered one by one through an opening (not shown) into the transfer chamber 9, and the substrate is held on the substrate holder 2.

To carry out the plasma treatment for the semiconductor substrate, firstly, the semiconductor substrate is transferred one by one into the transfer chamber 9 through an opening (not shown) and is held on the substrate holder 2. Then, according to need, the semiconductor substrate is transported to a prescribed position (a treatment position) of the reaction chamber 8 being held on the substrate holder 2. The treatment position can be determined according to the requirement of treatment properties.

Next, external energy such as microwave is introduced into the vacuum chamber 1, to which a process gas is supplied, from the external energy supply means 5 through the part of the quartz part 3 to generate plasma 10 in the reaction chamber 8. The generated plasma 10 is used for performing a process treatment such as film forming for the semiconductor substrate held on the substrate holder 2.

The structure of the vacuum chamber is configured so that the exhaust conductance of the reaction chamber 8 is larger with the substrate holder 2 positioned in the transfer chamber 9 than in the reaction chamber 8. The vacuum chamber 1 is provided with a gas introduction port 4, and a mixture of two or more different process gases can be introduced into the vacuum chamber 1 from the gas introduction port 4.

The vacuum chamber 1 is provided with two or more exhaust systems that include plural exhaust ports. In the embodiment, as shown in FIG. 1, an exhaust port (larger) 6 having a larger exhaust volume and an exhaust port (smaller) 7 having a smaller exhaust volume are provided. That is, one system is set to have a smaller exhaust conductance, and another system is set to have a larger exhaust conductance.

Meanwhile, in the specification, the "exhaust conductance" means one described below. That is, generally, in a molecular flow region, a mass flow rate Q of a gas flow through a route is proportional to the difference in pressures (P1−P2), wherein P1 is a pressure at the inlet and P2 is that at the outlet. A proportionality constant $C (=Q/(P1-P2))$ is defined as the exhaust conductance.

In the embodiment, the exhaust conductance at the exhaust port is defined as the exhaust conductance C=(gas flow volume Q)/(pressure difference ΔP), from the pressure difference ΔP on the exhaust route when a prescribed gas mass flow rate Q is supplied. Accordingly, when the mass flow rate Q flowing in the exhaust route is set to a constant value, a larger exhaust conductance C leads to a smaller pressure difference ΔP, and the chamber is set at a lower pressure.

The exhaust conductance on the large flow volume side is desirably set to a magnitude of ten times or more than that on the small flow volume side. When the conditioning is performed, evacuation is performed using the exhaust port (larger) 6 having a large exhaust conductance to make diffusing species (active species) can spread in the vacuum chamber 1.

Figure 7:
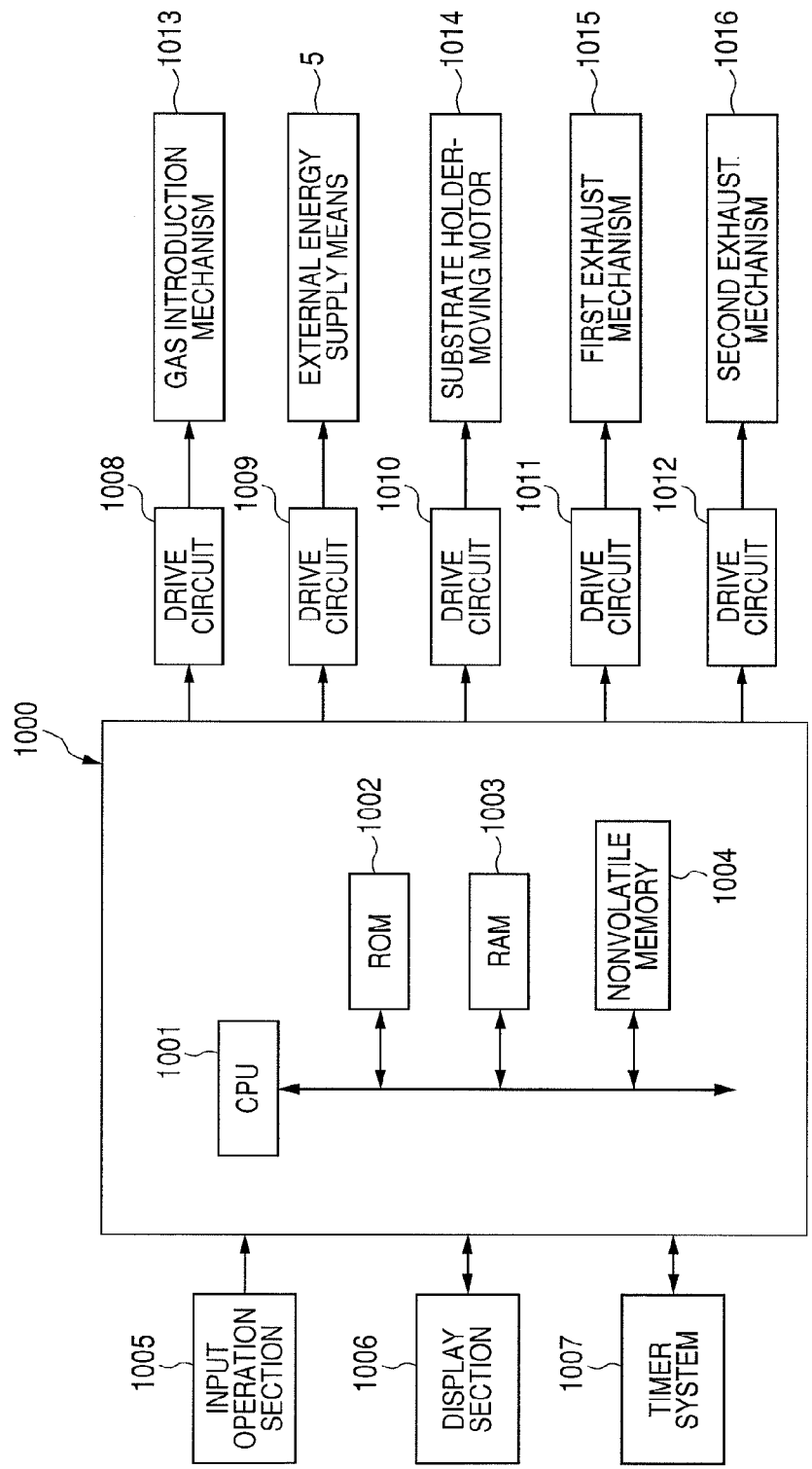
FIG. 7 is a block diagram showing a rough constitution of a control system in a plasma treatment apparatus according to the present invention.

FIG. 7 is a block diagram showing a rough constitution of a control system in a plasma treatment apparatus of the embodiment.

In FIG. 7, reference numeral 1000 is a control section as a control means for controlling the whole plasma treatment apparatus. The control section 1000 has a CPU 1001 executing a processing action such as various calculations, control or discrimination, and a ROM 1002 storing a control program of processing or the like described later in FIG. 5, which is executed by the CPU 1001. Moreover, the control section 1000 has a RAM 1003 for temporarily storing data of the CPU 1001 on processing operation or input data, a nonvolatile memory 1004 such as a flash memory or SRAM, and the like.

Moreover, to the control section 1000, an input operation section 1005 including a keyboard for inputting a prescribed directions or data, or various switches, a display section 1006 for performing various display including an input or setting state of the plasma treatment apparatus, and a timer system 1007 capable of measuring elapsed time are connected. Further, to the control section 1000, a gas introduction mechanism 1013, an external energy supply means 5, a substrate holder-moving motor 1014, a first exhaust mechanism 1015 and a second exhaust mechanism 1016 are connected via drive circuits 1008, 1009, 1010, 1011 and 1012, respectively.

The gas introduction mechanism 1013 is connected to the gas introduction port 4, and introduces a prescribed process gas into the vacuum chamber 1 via the gas introduction port 4 according to the directions from the CPU 1001. The first exhaust mechanism 1015 and the second exhaust mechanism 1016 are connected to the exhaust port 6 and the exhaust port 7 respectively, and discharges said process gas in the vacuum chamber 1 according to the directions from the CPU 1001. The external energy supply means 5 supplies external energy such as microwave to the vacuum chamber 1 according to the directions from the CPU 1001.

As described above, the substrate holder 2 can be moved up and down by the moving means. The substrate holder 2 is connected to an elevating mechanism owned by the moving means, and, by the drive of the substrate holder-moving motor 1014, the elevating mechanism is actuated to move the substrate holder 2 up and down. That is, the substrate holder-moving motor is driven according to the directions from the CPU 1001, and, by the drive, the substrate holder 2 is moved.

Next, the action in the embodiment will be explained. In the embodiment, as the conditioning, a process of oxidation or nitridation is selected, which is practiced before introducing the semiconductor substrate into the plasma treatment apparatus. Moreover, the conditioning is practiced when a definite period of time has elapsed from the last plasma treatment, or when a gas of a different kind or composition from the gas used in the last plasma treatment is to be used.

Figure 5:
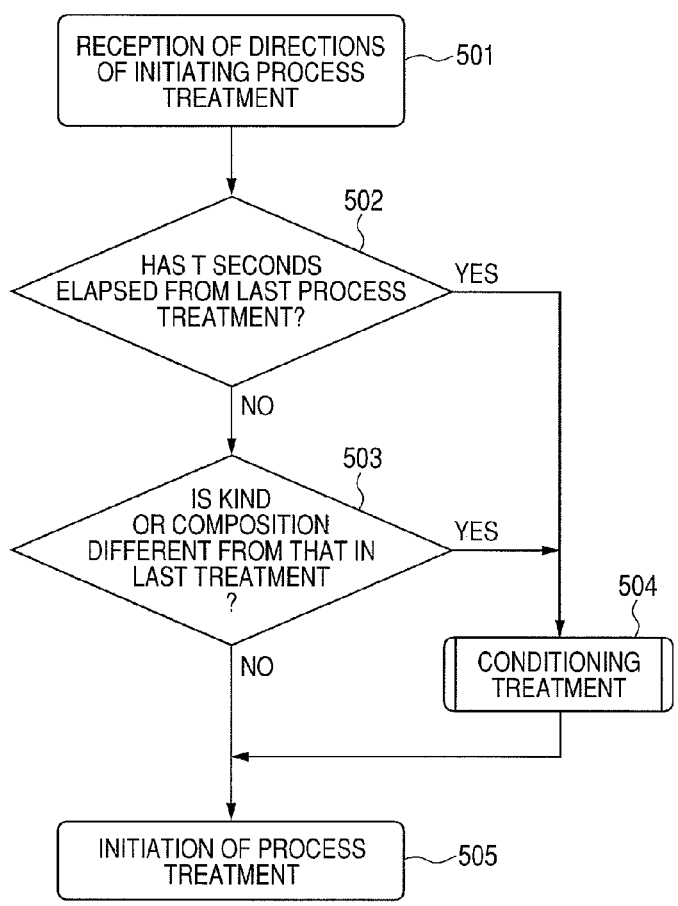
FIG. 5 is a flow chart showing a procedure of performing the conditioning in the present invention.

FIG. 5 is a flow chart showing a treatment procedure concerning the conditioning treatment of a plasma treatment apparatus of the embodiment. Hereinafter, respective steps concerning the conditioning will be explained with reference to the flow chart.

At Step 501, the control section 1000 acquires process treatment initiation information including gas specifying information (information showing what kind or composition of gas will be used) for specifying gas for use in a current process treatment as a command of the process treatment initiation. Meanwhile, the embodiment is a mode capable of practicing oxidation treatment and nitridation treatment as the process treatment. Accordingly, when the oxidation treatment is performed, the gas specifying information is "information showing that the gas to be used is oxygen," and when nitridation treatment is performed, the gas specifying information is "information showing that the gas to be used is nitrogen."

That is, when a user inputs whether the current process treatment is an oxidation treatment or a nitridation treatment, and directions concerning the initiation of the current process treatment via the input operation section 1005, the control section 1000 acquires the process treatment initiation information according to the user input. At this time, when the user inputs that the current process treatment is an oxidation treatment, the process treatment initiation information includes "information showing that the gas to be used is oxygen" as the gas specifying information. On the other hand, when the user inputs that the current process treatment is a nitridation treatment, the process treatment initiation information includes "information showing that the gas to be used is nitrogen" as the gas specifying information.

At Step 502, the control section 1000 determines whether or not a prescribed time (for example, T seconds) has elapsed from the last process treatment. That is, the control section 1000 refers to a timer system 1007, calculates the elapsed time from the termination of the last process treatment until now, and determines whether or not the elapsed time is over T seconds.

As a method for calculating the elapsed time, for example, when the last process treatment terminates, the control section 1000 reads out information concerning the time at the termination from the timer system 1007, to make the nonvolatile memory 1004 memorize it. And, when acquiring process treatment initiation information at Step 501, at this step, the control section 1000 reads out information concerning the current time from the timer system 1007, and, on the basis of the information concerning the read out current time and the information concerning the time at the termination of the last process treatment stored in the nonvolatile memory 1004, calculates the difference between the current time and the time at the termination of the last process treatment. The difference is the elapsed time. Meanwhile, the time at the termination may be clock time, or elapsed time (differential time) from a reference point.

Moreover, as another method for calculating the elapsed time, a timer system 1007 having a stopwatch function capable of measuring the elapsed time from starting time to stopping time is used, and the control section 1000 starts the stopwatch function of the timer system 1007 at the same time when the last process treatment is terminated. Then, when the process treatment initiation information is acquired at Step 501, at this step, the control section 1000 stops the stopwatch function of the timer system 1007. The control section 1000 determines the time period measured from the starting time till the stopping time as the elapsed time.

As described above, in the embodiment, either method may be used when the elapsed time from the last process treatment can be acquired.

At Step 502, the control section 1000 progresses to Step 504 when it determines that T seconds have elapsed from the last process treatment, or to Step 503 when it determines that T seconds have not elapsed from the last process treatment.

At Step 503, the control section 1000 determines whether or not the kind or composition of the gas used in the last process treatment is different from the kind or composition of a gas to be used in the current process treatment. In the embodiment, when a certain process treatment is terminated, the control section 1000 makes the nonvolatile memory 1004 store the specifying information of the gas used (information showing what kind or composition of gas was used) for specifying the gas used in the certain process treatment on the basis of the gas specifying information included in the process treatment initiation information. Accordingly, the control section 1000 holds information concerning the kind or composition of the gas used in the last process treatment (the specifying information of the gas used for the last process treatment) before the initiation of the current process treatment.

Consequently, at this Step, the control section 1000 compares the specifying information of the gas used for the last process treatment stored in the nonvolatile memory 1004 with the gas specifying information included in the initiation information of the current process treatment, and determines whether or not the gas to be used in the current process treatment is different from the gas used in the last process treatment.

Meanwhile, in order to make a gas to be used be compared with the gas used in the current process treatment before the next process treatment, when the current process treatment practiced subsequently is terminated, the control section 1000 replaces the "specifying information of the gas used for the last process treatment" stored in the nonvolatile memory 1004 by the specifying information of the gas used for the current process treatment.

At Step 503, the control section 1000 progresses to Step 504 when it determines that the gas to be used in the current process treatment is different from the gas used in the last process treatment, or, progresses to Step 505 when it determines that the gas to be used in the current process treatment is the same as the gas used in the last process treatment.

At Step 504, the control section 1000 performs the conditioning treatment that is characteristic of the present invention. At the beginning, the control section 1000 moves the substrate holder 2 to the transfer chamber 9 in a state where a semiconductor substrate is not held on the substrate holder, by driving the substrate holder-moving motor 1014 (by the drive of a moving means not shown) by sending a control signal to the substrate holder-moving motor 1014 via the drive circuit 1010. As the result of moving the substrate holder 2 to the transfer chamber 9, since the exhaust conductance of the reaction chamber 8 becomes large as described above to spread diffusing species (active species) by plasma up to the transfer chamber 9 side, it becomes possible to perform the conditioning for the whole inner wall of the vacuum chamber 1.

Moreover, by using the exhaust port 6 having a large conductance among plural exhaust ports existing in two or more systems, diffusing species further spread in the vacuum chamber 1 to make it possible to perform the conditioning for the whole inner wall of the vacuum chamber 1.

Next, the control section 1000 sends a control signal to each of the gas introduction mechanism 1013 and the external energy means 5. The gas introduction mechanism 1013 that received the control signal supplies a process gas into the vacuum chamber 1 from the gas introduction port 4, and the external energy supply means 5 that received the control signal supplies microwave to the vacuum chamber 1 to generate plasma 10. Next, the control section 1000 sends a control signal to the first exhaust mechanism 1015, and the exhaust mechanism 1015 that received the control signal evacuates the inside of the vacuum chamber 1 using the exhaust port 6 down to a prescribed pressure. By such action, the plasma treatment apparatus makes diffusing species generated by the plasma 10 adhere to the inner wall of the vacuum chamber 1 to adjust the atmosphere in the vacuum chamber 1 and to perform the conditioning for the whole inner wall of the vacuum chamber 1. After the conditioning is sufficiently performed in the vacuum chamber 1 in this manner, the control section 1000 progresses to Step 505.

At Step 505, the control section 1000 initiates the current process treatment. That is, when a semiconductor substrate is transferred in the vacuum chamber 1, the control section 1000 sends a control signal to the substrate holder-moving motor 1014 via the drive circuit 1010 to drive the substrate holder-moving motor 1014, thereby making the substrate holder 2 move into the reaction chamber 8 to perform the process treatment for the semiconductor substrate in the reaction chamber 8.

Meanwhile, in FIG. 5, Step 502 and Step 503 are performed as the step for determining the transition to the conditioning treatment (Step 504). However, in an embodiment of the present invention, it is also possible to design so that either one of Step 502 and Step 503 alone is performed.

As described above, in the embodiment, the control section 1000 determines whether or not the conditioning for the vacuum chamber 1 is necessary before performing the current process treatment for the semiconductor substrate, at Steps 502 and 503, based on the elapsed time from the last process treatment and the comparison between the gas used in the last process treatment and the gas to be used in the current process treatment. Then, when the necessity of the conditioning is determined to be positive, the conditioning is performed at Step 504, and then the current process treatment is initiated at Step 505. On the other hand, when the necessity is determined to be negative, the current process treatment is directly initiated at Step 505.

In the embodiment, the determination of "YES" at steps 502 and 503 acts as a trigger to initiate the conditioning treatment at Step 504, but direct directions of initiating the conditioning treatment by a user may be used as a trigger to initiate the conditioning treatment at Step 504. In this case, for example, the control section 1000 displays a user interface for inputting directions that determines whether or not the conditioning treatment is necessary and the kind of a process treatment (such as a kind of gas to be used for the process treatment) on the display section 1006, to allow the user to input prescribed directions. When the user inputs directions showing whether or not the conditioning treatment is necessary, and the kind of the process treatment via the input operation section 1005, the control section 1000 acquires the process treatment initiation information. Meanwhile, the process treatment initiation information includes information showing whether or not the conditioning treatment is necessary, in addition to the gas specifying information. When the process treatment initiation information is acquired, the control section 1000 determines whether or not the conditioning for the vacuum chamber 1 is necessary based on the information showing whether or not the conditioning treatment is necessary. Then, when the conditioning is determined to be necessary, the treatment moves to the conditioning at Step 504, and, when the conditioning treatment is determined to be unnecessary, the current process treatment is initiated directly at Step 505.

FIRST EXAMPLE

The conditioning was performed by a conditioning method of the present invention in which the position of the substrate holder was changed, or by a conditioning method (conventional method) in which the position of the substrate holder was not changed. And after that, a continuous oxidation treatment for 25 silicon wafers was performed to compare the change of the thickness of a silicon oxide film relative to the number of treated wafers. Meanwhile, before the continuous oxidation treatment, a continuous nitridation treatment was performed with the apparatus above, and the inside of the vacuum chamber 1 and the inner wall thereof was filled with a nitrogen atmosphere until just before the conditioning.

Respective conditions of the nitridation treatment, the conditioning and the oxidation treatment are shown below.

Figure 2:
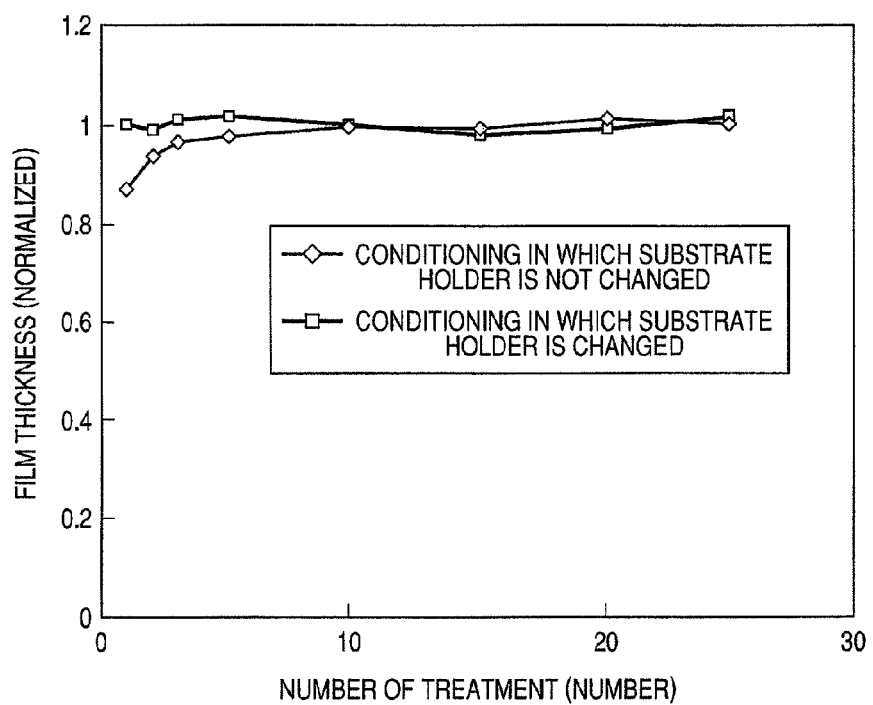
FIG. 2 is a drawing showing the comparison of the present invention with a conventional technique for the relation between the number of treated substrates and the change in the film thickness.
Figure 3:
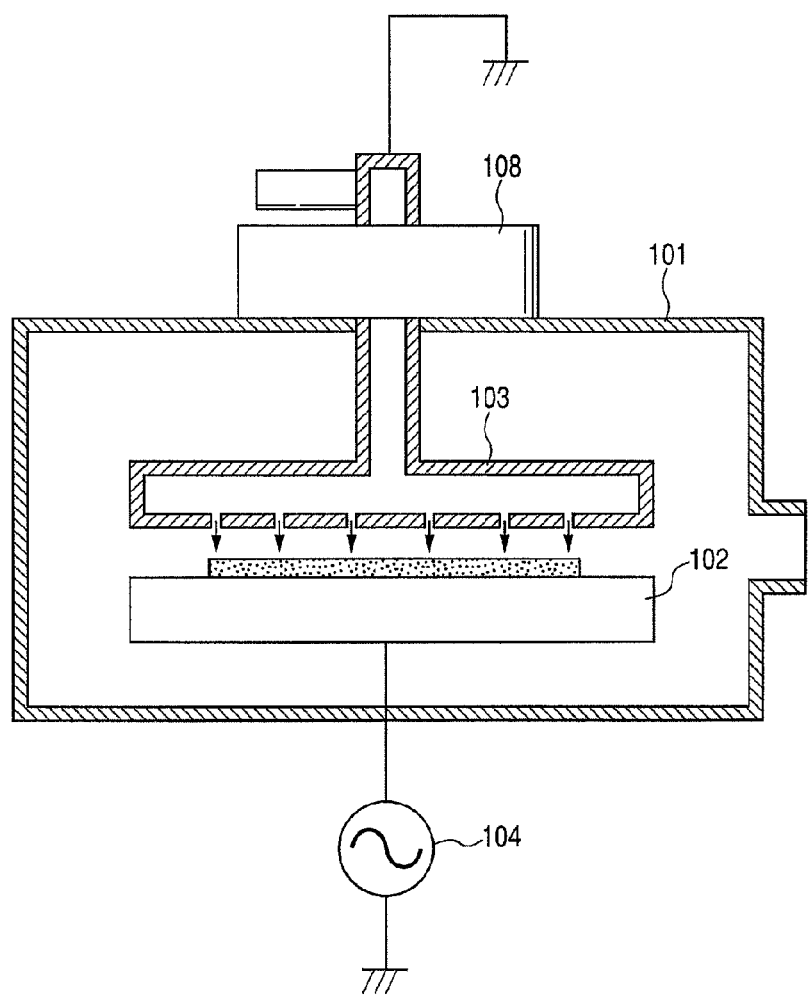
FIG. 3 is a schematic view showing a plasma treatment apparatus of a conventional example.
Figure 4:
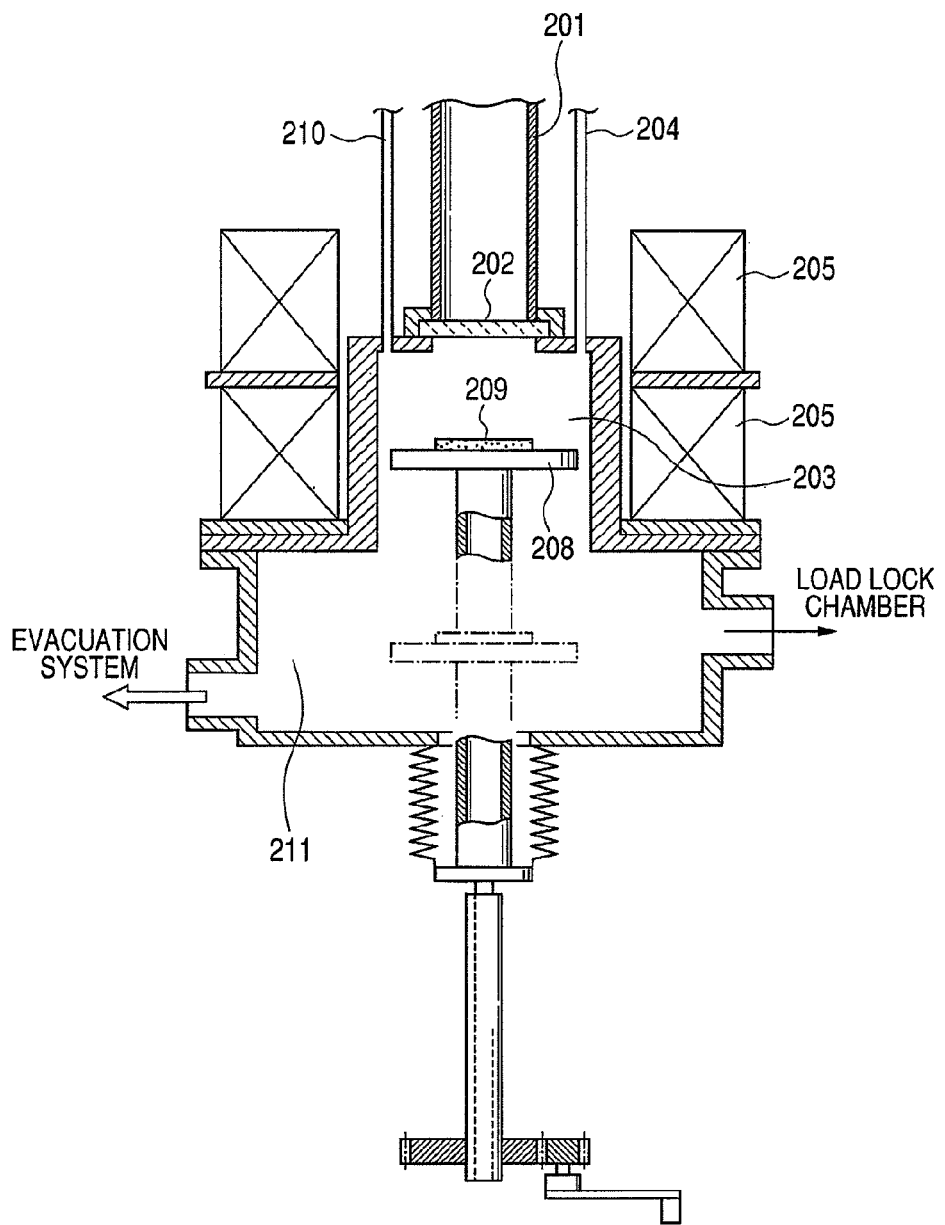
FIG. 4 is a schematic view showing a plasma treatment apparatus of another conventional example.

Nitridation treatment
Nitrogen gas flow rate: 500 sccm
Pressure in chamber: 100 Pa
Temperature: room temperature
Nitridation time: 3 minutes (25 wafers were treated)
Position of substrate holder: in reaction chamber
Conditioning
Oxygen gas flow rate: 500 sccm
Pressure in chamber: 50 Pa
Temperature: room temperature
Conditioning time: 3 minutes
Position of substrate holder: in transfer chamber
Oxidation treatment
Oxygen gas flow rate: 500 sccm
Pressure in chamber: 100 Pa
Temperature: room temperature
Oxidation time: 2 minutes
Position of substrate holder: in reaction chamber FIG. 2 shows results thereof. When the conventional technique, in which the substrate position was not changed and the method of the present invention in which the substrate position was changed, are compared, the method of the present invention makes it possible to perform a stable process treatment throughout the 25 wafers. Since external energy is directed only for generating plasma independently of the stage position, the external energy is not limited to microwave.

SECOND EXAMPLE

Using the same treatment apparatus as described in the first Example, the effect of the conditioning according to the present invention was verified by performing a plasma nitridation processing after a plasma oxidation processing.

Figure 6:
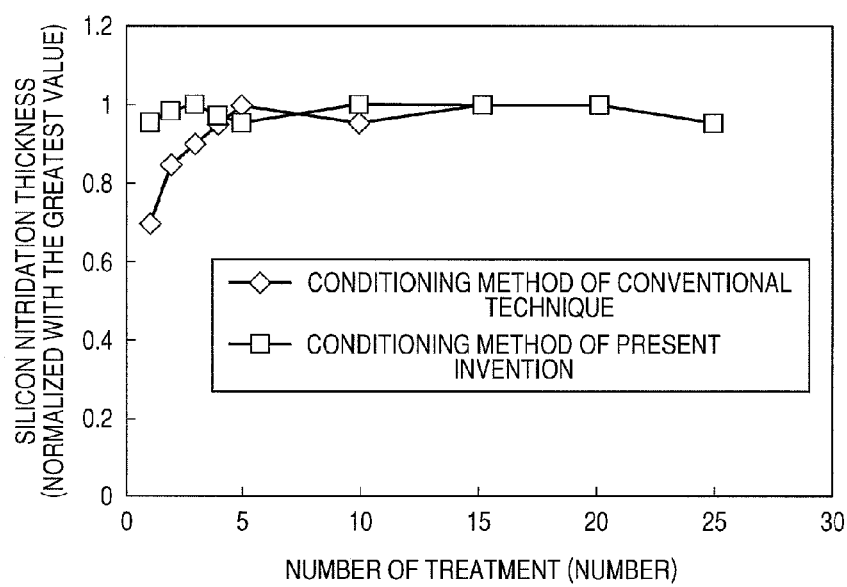
FIG. 6 is a drawing showing the comparison of a conventional technique and the present invention for the effect of the conditioning when plasma nitridation is performed after plasma oxidation has been performed.

The condition of plasma exposure upon the plasma oxidation and the plasma nitridation was set to be the same as in the first Example, the conditioning was performed after performing the oxidation treatment for 25 silicon wafers, and, further, the plasma nitridation treatment was continuously performed for 25 silicon wafers. The thickness of a silicon nitride film formed by the plasma nitridation treatment was measured by spectroellipsometry. As a result, as shown in FIG. 6, the thickness of a nitride film was thinner on the wafer that was processed just after the conventional conditioning technique in which the substrate position was not changed. But, in contrast, a stable thickness of the nitride film was obtained in the case where the conditioning according to the present invention was performed.

These results shows that the present invention removes a remaining atmosphere of the interior space of the chamber and one adhering to the surface thereof more effectively as compared with a conventional technique to adhere active species of the substrate-treatment plasma.

The embodiment has been explained referring to oxidation and nitridation as the example, but the present invention can be applied to cases where atmospheres in the vacuum chamber 1 are different, and can be used for every conditioning without limiting the gas system and the substrate treatment processes to those combined here.

Meanwhile, regarding the evacuation, it is more desirable to use an exhaust port having a smaller conductance upon the process treatment in order to make pressure control easy, and to use an exhaust port having a larger conductance upon the conditioning.

As described above, in the present invention, active species spread to the inner wall of the vacuum chamber 1 upon the conditioning, and, therefore, it becomes possible to perform the conditioning up to the interior wall of the transfer chamber 9 outside the reaction chamber 8. Therefore, the structure is such that the exhaust conductance of the reaction chamber 8 becomes larger when the substrate holder 2 is positioned in the transfer chamber 9 compared with when the substrate holder 2 is positioned in the reaction chamber 8, using the moving means for moving the substrate holder 2 up and down between the reaction chamber 8 and the transfer chamber 9. Accordingly, active species spread to the transfer chamber 9 to make it possible to perform the conditioning up to the inner wall thereof.

For example, the exhaust conductance C of a cylindrical pipe can generally be represented by:

$$C = 12133 \, D^3/L \quad \text{(Formula 1)}.$$

Here, in Formula 1, the symbol D is the diameter of the cylindrical pipe, and the symbol L represents the length of the cylindrical pipe.

In the embodiment, when the substrate holder 2 lies in the reaction chamber 8 the gap, formed between the wall surface of the vacuum chamber 1 and the substrate holder 2, works as the exhaust path and the substrate holder 2 works as a barrier wall in the exhaust path. In contrast, when the substrate holder 2 has moved into the transfer chamber 9, the substrate holder 2, the barrier wall, is lowered and, therefore, the cross-sectional area of the exhaust route is expanded. Accordingly, this holder movement can be regarded as the same that the diameter of the cylindrical pipe is enlarged in Formula 1. Therefore, in the embodiment, it is possible to enlarge the exhaust conductance when the substrate holder 2 is positioned in the transfer chamber.

Moreover, since the present invention uses microwave as the external energy source, plasma having a high density can be obtained, and active species tend to spread easily in the vacuum chamber 1 to give a more preferable effect.

Furthermore, the present invention can include two or more gas systems, wherein, after the process using a first gas and before the process using a second gas, the conditioning using the second gas is performed. Moreover, an embodiment of the present invention may be provided with two or more systems of plural exhaust ports, wherein one system has a small conductance and another system has a large conductance. While the conditioning of the vacuum chamber is being performed, evacuation using the exhaust port having a large conductance makes pressure control easy, and enables to spread the densified plasma upon the conditioning.

Other Embodiments

In the above described embodiment, an example of the plasma treatment apparatus incorporates the control section 1000 as a control device for controlling the plasma treatment apparatus, but the present invention is not limited to this. For example, the control section 1000 may be housed in a device (computer) separated from the plasma treatment apparatus. In this case, the computer may be connected to the plasma treatment apparatus via a interface method, and a driver software may be installed into the computer to control respective components of the plasma treatment apparatus (gas introduction mechanism 1013, external energy supply means 5, substrate holder-moving motor 1014, first exhaust mechanism 1015 and second exhaust mechanism 1016). With this arrangement, the computer can execute the control program shown in FIG. 5 and the conditioning treatment at Step 504.

The present invention can include a treatment method as an embodiment thereof, in which the computer executes a program code read out of a storage medium where a program to carry out the aforementioned control system is installed. That is, the storage medium, which can be read by the computer to run the aforementioned control system, is also to be understood as one embodiment of the present invention. Moreover, needless to say, not only the storage medium storing the computer program, but also the computer program itself can be included in the embodiment.

As such storage medium, for example, a Floppy (registered trade mark) disk, a hard disk, an optical disk, a magneto optical disk, a CD-ROM, a magnetic tape, a nonvolatile memory card, or a ROM may be used.

Furthermore, not only one that executes the processing by the single program stored in the storage medium, but also one that operates on an OS while cooperating with another software or the function of an extension board to execute the action of the embodiment is also included in the category of the embodiment.

The invention claimed is:

1. A method of a plasma treatment using a plasma treatment apparatus, the apparatus comprising:

a vacuum chamber having a transfer area for transferring a substrate to or from the inside and a reaction area for providing a process treatment for the substrate, and being used in a state of a reduced pressure, the vacuum chamber comprising a first exhaust port that is large so as to have a large conductance and a second exhaust port that is smaller than the first exhaust port so as to have a small conductance;
a substrate holder for holding the substrate;
means for generating plasma in the reaction area; and
a moving means for moving the substrate holder between the transfer area and the reaction area,
the method comprising the steps of:
a first step of moving the substrate holder to the transfer area by the moving means prior to providing the process treatment for the substrate in a state such that the substrate is not held on the substrate holder;
a second step of introducing a same gas as the gas for performing the process treatment for the substrate into the vacuum chamber;
a third step of generating plasma in the vacuum chamber by the means for generating plasma and making active species in the plasma adhere to the vacuum chamber inner wall to adjust an atmosphere in the vacuum chamber, while at the same time exhausting the atmosphere in the vacuum chamber using the first exhaust port; and
a fourth step of making the substrate holder hold the substrate and moving the substrate holder to the reaction area by the moving means to provide the process treatment for the substrate using the gas, while at the same time exhausting the atmosphere in the vacuum chamber using the second exhaust port, wherein
the third step is performed if it is determined that the gas to be used in the process treatment is different from a gas used in a last process treatment after a step of acquiring gas specifying information for specifying the gas to be used in the process treatment is performed, followed by a step of determining whether a kind or composition of the gas used in the last process treatment is different from the kind or composition of the gas to be used in the process treatment, and
the fourth step is performed if: 1) the third step is performed; or 2) it is determined that the gas to be used in the process treatment is identical to the gas used in the last process treatment after the step of determining whether the kind or composition of the gas used in the last process treatment is different from the kind or composition of the as to be used in the process treatment is performed.

2. A method of a plasma treatment according to claim 1, wherein the vacuum chamber is provided such that a first gas and a second gas can be introduced to, and the third step using the second gas is performed after a first process treatment using the first gas, and before a second process treatment using the second gas.

3. A method of a plasma treatment according to claim 1, wherein a diameter of the first exhaust port is larger than a diameter of the second exhaust port.

* * * * *